United States Patent [19]

Orpwood et al.

[11] Patent Number: 4,735,892

[45] Date of Patent: Apr. 5, 1988

[54] PRODUCT AND PROCESS FOR PRODUCING AN IMAGE ON A SUBSTRATE

[75] Inventors: Kenneth W. Orpwood; Robert G. Barnes; Edward R. Christie, all of Tasmania, Australia

[73] Assignee: Davies Brothers Ltd., Tasmania, Australia

[21] Appl. No.: 864,342

[22] PCT Filed: Jul. 25, 1985

[86] PCT No.: PCT/AU85/00169

§ 371 Date: May 22, 1986

§ 102(e) Date: May 22, 1986

[87] PCT Pub. No.: WO86/01010

PCT Pub. Date: Feb. 13, 1986

[30] Foreign Application Priority Data

Jul. 25, 1984 [GB] United Kingdom ............... 8418938

[51] Int. Cl.$^4$ ................................................ G03C 5/00
[52] U.S. Cl. ............................ 430/323; 430/271; 430/293; 430/295; 430/324; 430/329; 430/330; 430/394; 430/523; 430/935
[58] Field of Search ............. 430/271, 323, 325, 326, 430/329, 330, 324, 394, 320, 293, 295, 523, 935

[56] References Cited

U.S. PATENT DOCUMENTS 4,262,080 4/1981 Fuhr ................................. 430/271

FOREIGN PATENT DOCUMENTS 2049210 12/1980 United Kingdom .

Primary Examiner—Nancy A. B. Swisher
Assistant Examiner—José Dees
Attorney, Agent, or Firm—Sughrue, Mion, Zinn, Macpeak & Seas

[57] ABSTRACT

A photosensitive element suitable for manufacture of an external nameplate comprises a substrate carrying a cured non-etchable background surface, an etchable curable polymeric layer that can be etched imagewise to provide an image viewable against a background, and a photosensitive layer. A nameplate or other sign is obtained by imagewise photoexposure of the photosensitive layer, developing the image to reveal the curable layer, etching the revealed curable layer imagewise, removing the residual photosensitive material and then baking the product.

15 Claims, No Drawings

PRODUCT AND PROCESS FOR PRODUCING AN IMAGE ON A SUBSTRATE

This invention relates to photosensitive elements and processes intended for producing a coloured typeface or other design image on a substrate. The invention relates particularly to elements and processes for the production of wear resistant images or rigid substrates, the products thus serving as, for instance, nameplates and design boards.

At the present time, nameplates and similar such signs for directory boards and so forth are often made by a commercial anodising process wherein a metal substrate is made the anode is an electroplating system and the typeface or design colouring is electrodeposited on an unprotected portion of the metal substrate. While this process produces a good fixed image on the substrate it is, however, severly limited in respect of the substrates and colours which can be employed. For instance, the only really practical substrate is aluminium and the colours are restricted to a few anodising colours.

It is well known to form an image on a substrate for certain purposes by image-wise exposure of a photosensitive coating on the substrate followed by development of the exposed coating to reveal the substrate imagewise where the photosensitive coating is removed. It is also well known to provide an inert coloured layer between the photosensitive layer and the substrate and this coloured layer may also be removed image-wise during development of the photosensitive layer. Cured photosensitive material therefore forms the image against a background of the coloured layer or the substrate. The cured photosensitive layer is usually sufficiently wear resistant for the purposes for which it is intended, for instance for printing, but the process has also been adapted for use in the production of, for instance, nameplates.

This process entails coating a substrate with a photosensitive resinous lacquer and projecting the required image onto the layer of photosensitive lacquer using ultraviolet radiation. The image in the coated substrate is then developed in an appropriate developer to form a tough chemical-resistant layer and the unexposed portion of the coating dissolved away. While this process is suitable for use with a considerably larger variety of substrates than can be used with the anodising process, it is, however, restricted insofar as it cannot be employed on plastics substrates, as these are generally soluble in the photosensitive lacquer or developer and is restricted to the single colour to which the lacquer turns on exposure, generally black.

It is also known from GB No. 2049210B to make a keybutton board by imagewise photoexposure of a light-sensitive layer to reveal an intermediate layer over a substrate, etching the photosensitive and intermediate layers imagewise to reveal the substrate imagewise, and then casting a clear polymeric material over the resultant surface. The etchant for the intermediate layer penetrates down through the intermediate layer until the etchant reaches a non-etchable surface carried by the substrate, i.e., the surface of the substrate, and this non-etchable surface serves as the background. Although this process is satisfactory for keybutton boards it is again restricted to a single colour and the properties of the final product may be inadequate for external use, for instance as name plates.

Accordingly the existing processes all tend to suffer from the disadvantage that the colour choice is limited and also the wear resistance of the final design is often unsatisfactory for nameplate use, paticularly outdoors. For instance the background colour or the raised lettering or both may crack or otherwise deteriorate when exposed to the weather.

A photosensitive element according to the invention is one which comprises, in order, a substrate, a non-etchable background surface carried by the substrate, an etchable curable polymeric layer and a photosensitive layer and in which, after imagewise photoexposure, the curable layer and the photosensitive layer can be etched imagewise and the residual curable layer can be revealed and cured to provide a cured image viewable against the background surface, and this element is characterised in that the background surface is a cured, polymeric, etch resistant layer that has been coated over the substrate.

Such an element may be made by forming the background layer by applying a curable polymeric layer over the substrate and baking the resultant coated substrate to cure the layer and render it etch resistant, and then applying the said curable polymeric and photosensitive layers over this.

A permanent image may be made, according to the invention, on the substrate by exposing the element imagewise to radiation to which the photosensitive layer is sensitive, developing the resultant image to reveal the curable layer imagewise (as a negative or a positive image), etching the revealed parts of the curable layer to reveal the corresponding parts of the cured background layer, removing the residual photosensitive material to reveal the residual curable layer, and baking the element to cure the revealed curable layer.

For instance, if development of the imagewise exposed photo-sensitive layer reveals the curable layer as the negative image, the subsequent etching of the revealed negative image in the curable layer will reveal the identical negative image in the background layer. Thereafter the residual positive image in the photosensitive layer is removed by etching using an appropriate etchant to reveal the identical positive image in the curable layer. The element is then baked to form a cured positive image formed from the curable layer viewable against a negative image in the background layer.

It is of course necessary that there should be a visual or optical difference between the background layer and the cured image formed from the revealed curable layer, in order that the existence of the image is visually apparent. Although interesting effects can be obtained by, for instance, forming the layers with different gloss values or in some other way creating optical differences between the layers it is preferred for the curable layer to be coloured to a colour different from the apparent colour of the background layer, so that the image in the curable layer is of a different colour from the apparent image of the background. By referring to the apparent colour of the background layer we mean either its actual colour, if it is a coloured layer, or the colour it appears to have as a result of being a transparent layer through which some underlying colour is apparent.

The element may include additional layers. Best results are obtained if there is a bonding layer between the curable layer and the photosensitive layer to improve adhesion of the photosensitive layer to the curable layer. This bonding layer must adhere both to the curable layer and the photosensitive layer and must be capable of being removed with the removable photosensitive layer during development or by subsequent etching, for instance prior to or whilst etching the revealed parts of the curable layer to reveal the corresponding parts of the background layer. Also it should be capable of being removed with the residual photosensitive material, or in a subsequent etching step, in order to reveal the residual curable layer.

The curable layer may be formed of a colourless over layer that will cure upon baking to give the cured image viewable against a coloured under layer that provides the background layer. When the image that is viewable against the background is to be formed of two layers in this manner it is not essential for the upper, colourless, layer to be present in the initial photosensitive element. Thus the etchable curable layer does not have to have the ultimate wear resistant properties upon curing since these can be imparted to it after removing the residual photosensitive material. In particular the invention includes a process in which, after removing the residual photosensitive material to reveal the residual curable layer, an overall layer of colourless, curable polymeric material is applied and the element is then baked to cure this layer. This application may be effected before baking the element to cure the revealed curable layer, in which event a single baking operation may cure both layers, or the overall clear layer can be applied and baked after baking the revealed curable layer.

The background layer may be formed of, for instance, one or two other layers. If the substrate has a surface of the colour desired for the background of the final product the background layer may be a single substantially clear cured layer although it may be desirable to provide a substantially clear undercoat layer beneath it, so as to improve bonding.

In another type of element the background layer is a substantially colourless cured layer but is applied over a coloured polymeric layer that is between the substrate and the background layer. Again there may be one or more undercoats to improve adhesion of the layers, for instance to the substrate.

The same coating materials may be used for forming a colourless background layer as are suitable for forming a colourless overall layer applied after removing the residual photosensitive material.

One advantage of the invention is that, as a result of forming the final image from the background and curable layers it is possible to formulate the background layer so that it will not only provide the background image or provide a clear protective coat over the substrate, but will also serve as an excellent undercoat for the curable layer, providing good adhesion and preventing cracking of the curable layer during curing of it or during wear. Prior to the invention the background to the image was the surface of the substrate.

The substrate is generally a rigid substrate, often of metal. The metal can have a polished surface provided the background layer, or an undercoat for it, is formulated to adhere well to the polished surface. Preferably however the surface is slightly roughened, for instance by abrasion or preferably, when appropriate, anodising. A preferred metal substrate is therefore anodised aluminium but other suitable substrates are stainless steel, glass and ceramic substrates. Plastics substrates can be used, for instance formed of acrylic material.

The background layer must be a cured polymeric layer and so will have been applied as a curable material that is then cured, generally by baking. Any underlayers to the background layer are preferably also curable. Similarly the curable layer between the background layer and the photosensitive layer must also be capable of being cured, again generally by baking. Preferably all the layers in the photosensitive element (except the photosensitive layer and any bonding layer) are of polymeric material that can be cured by baking.

Curing of each layer is preferably achieved by baking at above 150° C., often 180° to 200° C. although sometimes up to 220° C. may be desirable. Baking is generally conducted for half to 2 hours, typically 1 to 2 hours although sometimes up to 3 hours is desirable.

Each curable layer used in the manufacture of the photosensitive elements and the exposed products of the invention is preferably an acrylic paint, most preferably based on polymethyl methacrylate. The paint normally includes 5 to 30% low boiling organic solvents such as alcohols (for instance ethanol and butanol) and ketones (such as methylethyl ketone or acetone) and 10 to 70% higher boiling organic solvents, generally aromatic hydrocarbons such as toluene and xylene. It will normally contain some monomeric curable material, for instance methyl methacrylate, as well as polymeric curable material, for instance polymethyl methacrylate. It will normally contain 5 to 20% by weight plasticiser, for instance selected from butylbenzyl phthalate, diethylhexyl phthalate and other phthalate or other external plasticisers and in some instances may contain an internal plasticiser, for instance 2-ethoxy ethanol.

Undercoat material, for instance between the background layer and the substrate, may be unpigmented but the inclusion of an inorganic pigment such as titanium dioxide is often preferred to improve the properties of the layer. Layers that are coloured must include a colourant that is resistant to the curing conditions to which the coat will be subjected during the preparation of the final product.

The bonding layer, if present, preferably includes a cellulosic material, most preferably nitrocellulose, as the principle bonding agent. Preferably it includes plasticisers and/or tackifying resins in order to improve the adhesion due to its polymeric components.

The photosensitive layer may be a negative acting or a positive acting photosensitive material. Preferably it is negative acting. A suitable photosensitive material is a polymeric base, for instance a colloid or, more usually, a polyvinyl alcohol base, containing ammonium dichromate as photosensitiser. The nature of the exposure that is used will be chosen having regard to the photosensitiser, but is often ultraviolet light.

Exposure of the photosensitive image is generally by ultraviolet or other radiation through a transparency, generally a negative transparency, that is preferably laid against the photosensitive layer. Development is by washing or gentle rubbing with a developer appropriate for the chosen photosensitive layer, the developer generally being aqueous, usually water. The development reveals an image-wise distribution of curable layer, and an image-wise distribution of exposed (or with some photosensitive materials unexposed) photosensitive material.

The surface is then etched to remove curable layer whilst leaving the residual photosensitive material. Since the curable layer is of a curable material it is generally etchable using an organic solvent, suitably a solvent conventional for diluting the composition. For instance if the composition is an acrylic paint composition, the solvent may be acrylic thinners. The solvent does not etch the background layer, since that was previously cured by baking. At this stage therefore the element carries a positive or negative image of photosensitive layer viewable against the background layer. The photosensitive layer is then removed, for instance by etching with chromic acid or other appropriate remover. When, as is highly preferred, there is a bonding layer between the curable layer and the photosensitive layer this may be removed by the developer for the photosensitive layer but is generally resistant to this and so must be removed by an etchant appropriate for it. Suitable bonding layers are generally removable using an organic solvent, such as industrial alcohol or methylated spirits. If the properties of the curable layer, after curing, are inadequate it is possible to apply an overall, clear, curable layer at this stage. The product is then baked to provide an imagewise distribution of the previously curable layer viewable against the initial background layer, and either each layer has very good wear resistance or the entire image is covered by a cured, clear, layer that has very good wear resistance.

If it is desired to form a multi-colour image, having colours additional to those of the initial curable and background layers, the product obtained by the described photoexposure, development, etching, removal and baking steps may be used as the non-etchable background surface of a photosensitive element that is then subjected to the same processing as before. Thus a differently coloured curable polymeric layer may be applied over it followed by a photosensitive layer (generally after a bonding layer) to form the photosensitive element. In use, that element is subjected to a different imagewise photoexposure and is then subjected to development, etching, removal and baking, all as before.

Each of the layers in the photosensitive elements of the invention is usually relatively thin, for instance below 3 mg/cm². It is particularly preferred to apply the photosensitive layer by spraying and often all the layers are applied by spraying. The paints must therefore be formulated in known manner to render them suitable for spraying without foaming or entrapment of air bubbles.

Typically the photosensitive layer is below 1 mg/cm², for instance 0.4 to 0.9 mg/cm² and the bonding layer, if present, is below 0.5 mg/cm², often 0.2 to 0.4 mg/cm². A clear background layer is often below 1.7 mg/cm², preferably 0.5 to 1.5 mg/cm². If there are layers between the background layer and the substrate these are typically below 1 mg/cm², often 0.5 to 0.8 mg/cm². The curable layer and any coloured background layer is often 1.5 to 3 mg/cm², typically about 2 to 3 mg/cm². Any other layers that are applied are generally in the range 0.5 to 1 mg/cm².

EXAMPLE 1

The substrate is clear anodised aluminium sheet 10 microns on side in accordance with AS1231-19767. The sheet satisfies Aluminium Development Council AS5005 H-34. Thickness of sample 1.0 mm.

Scrub the aluminium substrate with feltspar or pumice powder to remove surface impurities, wash and dry.

Apply a primer layer at the rate of 0.73 mgs per cm² (18.07% per cm²) using a paint of the formula

| Non-volatile matter | 10% |
| --- | --- |
| Methylethyl ketone | 8% |

-continued

| Butanol | 1% |
| --- | --- |
| Methyl methacrylic | 1% |
| Toluene | 25% |
| Xylene | 6% |
| Butyl benzyl phthalate | 2% |
| Diethylhexyl phthalate | 1.5% |
| Other phthalate | 1.5% |
| Polymethyl methacrylate | 30% |
| Titanium dioxide | 14% |

Formulate a coloured curable paint, using British standard colour 175, light French blue, based on 62% of the primer paint described above with added pigments by volume mid-blue 20%, maroon 13% and red ochre 5%. Apply a background layer of this over the primer at a rate of 1.96 mg/cm² (48.51% per cm²).

Allow to dry and apply a clear sealer at the rate of 0.65 mg/cm² (16.09% per cm²). The paint for this consists of

| Non-volatile matter | 10% |
| --- | --- |
| Ethanol | 6% |
| Acetone | 5% |
| Ethyl acetate | 1% |
| Butanol | 6% |
| 2-ethoxyethanol (ethylene glycol monoethyl ether) | 1% |
| Toluene | 15% |
| Butyl acetate | 1% |
| Xylene | 40% |
| Plasticiser (Butylbenzyl phthalate) | 6% |
| Polymer (Polymethyl methacrylate) | 8% |
| Methyl methacrylate | 1% |

Place in the oven for one hour at 200° C.

Apply a curable coloured layer having the same general composition as the curable background layer described above, but with different pigments. Allow to dry.

Spray on a bonding agent layer formulated from

| Non-volatile matter | 9% |
| --- | --- |
| Ethanol | 20% |
| Ethyl acetate | 12% |
| 2-ethoxy ethanol (ethylene glycol monoethyl ether) | 15% |
| di (2-ethyehexyl) phtlalate | 3% |
| Aryl alkyl phthalates | 1% |
| Nitrocellulose | 22% |
| Polyketone Resin | 15% |
| Methyl pimaradienoate | 1% |
| Methyl dehydroabietate | 1% |
| Methyl abietate | 1% |

Allow to dry and then spray on photosensitive layer (SPSR) at the rate of 0.42 mgs per cm² (10.40% mgs per cm²). Dry by hot air delivery.

Place in a vacuum frame, position film negative of image required. Apply vacuum to gain contact and expose to ultra violet light.

Develop the image by washing with water to remove unexposed SPSR. Dry to remove water and apply acrylic thinners to remove the uncured unexposed layer. The residual photosensitive layer, that is to say the resist that was exposed by ultraviolet light, is then removed from the residual curable layer in the image area by immersing the product in chromic acid. The product is then washed and dried with the bonding agent exposed. This agent is removed using industrial alcohol. The whole element is then swabbed using white spirit or similar agent.

Apply the curable sealer described above over the whole surface, allow to dry and place the completed sign in the preheated over for one hour at 200° C. Remove from the oven, allow to cool and wipe clean with white spirits prior to packing.

If a multi-colour image is desired the resultant coating can be used as the background layer for a further process.

We claim:

1. A process of forming a permanent image on a substrate by:
   1. imagewise photoexposure of a photosensitive element comprising, in order, a substantially non-etchable background surface carried by the substrate, an etchable polymeric layer and a photosensitive layer that is sensitive to the radiation of the photoexposure,
   2. developing the exposed photosensitive layer imagewise to reveal the actual layer imagewise as a negative or positive image,
   3. etching the revealed parts of the etchable layer to reveal the corresponding parts of the background surface, and,
   4. removing the residual photosensitive material to reveal the residual etchable polymeric layer as a positive or negative image, characterised in that the background surface of the photosensitive element is a background cured, etch resistant, polymeric layer that is not removed during the process, and the etchable polymeric layer is heat curable and, after removing the said residual photosensitive material, the revealed image of etchable polymeric material is cured by heating to form the permanent image.

2. A process according to claim 1 comprising, before or after the said heating of the said revealed image of etchable polymeric layer, applying an overall layer of colourless polymeric material and then curing this layer by heating.

3. A process for forming a permanent multi-colored image on a substrate comprising the steps, according to claim 1 and further comprising the subsequent additional steps of applying an overall layer of a differently coloured etchable, curable layer and then an overall photosensitive layer onto the product of claim 16, photoexposing the resultant element and then repeating the steps of developing, etching, removing residual photosensitive material, and heating to cure the revealed etchable polymeric material.

4. A process according to claim 3 comprising, before or after the said heating of the said revealed image of etchable polymeric layer, applying an overall layer of coloureless polymeric material and then curing this layer by heating.

5. A process according to claim 1 in which the etchable curable layer is coloured to a colour different from the apparent colour of the background layer.

6. A process according to claim 1 in which the background layer comprises a substantially colourless cured polymeric layer over a coloured surface having a colour different from the colour of the curable layer.

7. A process according to claim 6 in which the coloured surface is a coloured polymeric layer between the substrate and the background layer.

8. A process according to claim 6 in which the coloured surface is the substrate.

9. A process according to claim 1 in which the background layer comprises a coloured cured polymeric layer.

10. A process according to claim 1 in which the photosensitive element comprises one or more polymeric undercoat layers between the background layer and the substrate.

11. A process according to claim 1 in which the photosensitive element comprises a bonding layer between the etchable curable layer and the photosensitive layer and this bonding layer is removed during development or by etching prior to or during the etching of the revealed parts of the etchable layer.

12. A process according to claim 1 in which the polymeric etchable and background layers are formed of acrylic paint.

13. A photosensitive element for forming a permanent image on a substrate and which comprises, in order, a substantially non-etchable background surface carried by a substrate, an etchable polymeric layer and a photosensitive layer and in which, after imagewise photoexposure, the photosensitive layer can be developed imagewise to reveal an etchable layer that can be etched imagewise and the residual etchable material can be revealed by removing the residual photosensitive material and cured to provide a cured image viewable against the background surface, characterized in that the etchable polymeric layer is heat curable and the background surface is a cured, polymeric, etch-resistant layer that has been coated over the substrate.

14. A process for making an element for forming a permanent image on a substrate, said element being comprised, in order, of a substantially non-etchable background surface carried on a substrate, an etchable polymeric layer and a photosensitive layer and in which, after imagewise photoexposure, the photosensitive layer can be developed imagewise to reveal an etchable layer that can be etched imagewise and the residual etchable material can be revealed and cured to provide a cured image viewable against the background surface, characterized in that the etchable polymeric layer is heat curable and the background surface is a cured, polymeric, etch-resistant layer that has been coated over the substrate, comprising forming the background layer by applying a curable polymeric layer over the substrate and heating the coated substrate to cure the layer and render it etch-resistant, and then applying the etchable curable polymeric layer and the photosensitive layer.

15. A process according to claim 14 in which each layer is applied by spray to a weight of below 3 mg/cm squared.

* * * * *